United States Patent [19]

Kuo et al.

[11] Patent Number: 5,357,476
[45] Date of Patent: Oct. 18, 1994

[54] APPARATUS AND METHOD FOR ERASING A FLASH EEPROM

[75] Inventors: Clinton C. K. Kuo; Ko-Min Chang; Henry Y. Choe, all of Austin, Tex.

[73] Assignee: Motorola, Inc., Schaumberg, Ill.

[21] Appl. No.: 69,327

[22] Filed: Jun. 1, 1993

[51] Int. Cl.⁵ ............................................. G11C 11/34
[52] U.S. Cl. ................................... 365/218; 365/185; 365/900
[58] Field of Search ........................ 365/218, 185, 900

[56] References Cited

U.S. PATENT DOCUMENTS

| | | | |
|---|---|---|---|
| 4,267,558 | 5/1981 | Guterman | 357/41 |
| 4,996,571 | 2/1991 | Kume et al. | 365/218 |
| 5,065,364 | 11/1991 | Atwood et al. | 365/218 |
| 5,067,108 | 11/1991 | Jenq | 365/185 |
| 5,095,461 | 3/1992 | Miyakawa et al. | 365/218 |
| 5,109,361 | 4/1992 | Yim et al. | 365/218 |
| 5,130,769 | 7/1992 | Kuo et al. | 357/23.5 |
| 5,138,576 | 8/1992 | Madurawe | 365/125 |
| 5,233,562 | 8/1993 | Ong et al. | 365/218 |

OTHER PUBLICATIONS

ULSI Device Development Laboratories, NEC Corp., "A Novel Erasing Technology for 3.3 V Flash Memory with 64 Mb Capacity and Beyond", K. Oyama, IEEE, Apr. 1992, IEDM, pp. 607-610.

ULSI Research Center Toshiba Corp., "New Write/Erase Operation Tech. for Flash EEPROM Cells to Improve the Read Disturb Characteristics", T. Endoh, IEEE, Apr. 1992, IEDM, pp. 603-606.

IEEE Journal of Solid-State Circuits, "High-Voltage Regulation and Process Considerations for High Density 5 V-Only E2PROM's", Duane H. Oto, vol. SC-18, No. 5, Oct. 1983.

Semiconductor Device Engineering Laboratory, Toshiba, Corp., "A Self-Convergence Erasing Scheme for a Simple Stacked Gate Flash EEPROM", Seiji Yamada, IEEE, Sep. 1991, IEDM, pp. 307-310.

Primary Examiner—Eugene R. LaRoche
Assistant Examiner—Tan Nguyen
Attorney, Agent, or Firm—Daniel D. Hill

[57] ABSTRACT

A flash EEPROM array (22) is erased and a threshold voltage distribution of the erased flash EEPROM cells (36, 39-46) is converged to within a predetermined voltage range by using a two-step erasing procedure. In the first step, flash EEPROM array (22) is electrically bulk erased using a conventional bulk erase procedure. Electrons are tunneled from the floating gate (38) to the source, causing cells (36, 39-46) to have a relatively low threshold voltage. In the second step, the threshold voltage distribution of the array (22) is converged to within the predetermined voltage range by grounding the source and drain of each cell (36, 39-46), while concurrently applying a high positive voltage to the control gate (27) of each cell (36, 39-46). Some electrons are tunneled back to the floating gate (38), thus converging the threshold voltage distribution to within a predetermined range.

11 Claims, 2 Drawing Sheets

STEP 1
ERASE

STEP 2
V_T CONVERGENCE

APPARATUS AND METHOD FOR ERASING A FLASH EEPROM

FIELD OF THE INVENTION

This invention relates generally to nonvolatile memories and more particularly to erasing a flash EEPROM (electrically erasable programmable read only memory).

BACKGROUND OF THE INVENTION

A nonvolatile memory is a type of memory that retains stored data when power is removed. There are various types of nonvolatile memories, including read only memories (ROMs), programmable read only memories (PROMs), erasable programmable read only memories (EPROMs), and electrically erasable programmable read only memories (EEPROMs). EEPROMs and flash EEPROMs are commonly used in data processing systems requiring a nonvolatile memory that is reprogrammable.

A flash EEPROM generally includes an array of floating gate, single transistor memory cells. As with an EPROM, the entire memory array of a flash EEPROM is bulk erased, but instead of using ultraviolet (UV) light to erase the cells, an electrical signal is used. The term "flash" refers to the fact that the flash EEPROM can be erased much more quickly than an EPROM. It may take less than two minutes to erase a flash EEPROM memory cell, compared to about 20 minutes to erase an EPROM with UV light.

Once the flash EEPROM is bulk erased, Selected cells are programmed using various methods. A programmed flash EEPROM cell provides a logical one when programmed and an unprogrammed flash EEPROM cell provides a logical zero. A cell may be programmed by applying a high programming voltage to the control gate, and a power supply, voltage to the drain with the source grounded. Hot carrier injection causes electrons to be transported from the source region to the floating gate and become trapped since the floating gate is isolated from the control gate by an interpoly dielectric layer and from the drain-source region by a thin oxide layer. The effect of trapping electrons on the floating gate is to raise the floating gate transistor's threshold voltage ($V_T$). The raised $V_T$ prevents the transistor from becoming conductive to the array ground at normal read cycle voltages, thereby providing a logic one that is sensed by a sense amplifier when read. The non-programmed transistors have a lower $V_T$ and become conductive to the array ground at normal read cycle voltages and provide a logic zero when read. Because the floating gate is isolated, the cell can remain programmed or erased for an extended period of time (10 years or longer).

To erase the array of floating gate transistors, a high positive voltage is applied between the source and the control gate of each transistor. Electrons are transported from the floating gate to the source region by Fowler-Nordheim tunneling. Removal of the electrons from the floating gate has the effect of lowering the $V_T$ of the floating gate transistor If the high positive voltage is applied for too long, some of the floating gate transistors may be over-erased. A floating gate transistor is over-erased when the $V_T$ of the transistor becomes negative. A floating gate transistor normally functions like an enhancement mode device, however with a negative $V_T$ the floating gate transistor functions like a depletion mode device. When the floating gate transistor operates in depletion mode, it stays at least partially conductive, even when not selected, and may prevent the cells on the same bit line from being correctly read, leading to failure of the entire memory. U.S. Pat. No. 5,130,769, "Nonvolatile Memory Cell", issued to Kuo et al. on Jul. 14, 1992, describes a prior art flash EEPROM cell (FIG. 1 and FIG. 2) that is susceptible to over-erasure.

Because of variations in process and erase timing, the flash EEPROM cells may not erase at the same rate. Therefore, the floating gate threshold voltages may differ by 2 volts or more after aft erase operation. A wide distribution of threshold voltages reduces margins and limits the ability of the flash EEPROM array to function properly and reliably at low power supply voltages, such as 3 volts.

Several techniques have been developed to correct, and to prevent, over erasure of flash EEPROM cells and to converge the $V_T$ distribution of the floating gate transistors within a predetermined voltage range. One common technique used to prevent over-erasure is known as intelligent erase. To perform an intelligent erase, all of the flash EEPROM cells of the array are first programmed. Then, the cells are gradually erased in steps using an erase pulse of relatively short duration. After the application of each erase pulse, a verification step is used to check the $V_T$ to determine if the $V_T$ has been sufficiently reduced. The erase and verify steps are repeated until none of the cells register a programmed response to the verification step. This technique is generally effective, however it is time consuming and adds complexity to the flash EEPROM.

Another technique for preventing over-erasure is to form a split gate on the source side of the floating gate transistor which maintains the cell in enhancement mode even when the floating gate is driven into depletion. The split gate functions in a manner similar to a select transistor in an EEPROM to limit drain-source current during erasure. The split gate is formed by allowing the control gate to overlap the source region of the floating gate transistor. Having a split gate eliminates the problem of over-erasure, but increases the size of the flash EEPROM cell, which limits the number of flash EEPROM cells that can be included in a single flash EEPROM array of a given density. An example of a split gate flash EEPROM cell is described in U.S. Pat. No. 5,130,769, "Nonvolatile Memory Cell", issued to Kuo et al. on Jul. 14, 1992.

A technique which has been used to correct, rather than prevent over-erasure is known as a self-convergence erasing scheme. This scheme is described in an article entitled "A Self-Convergence Erasing Scheme For A Simple Stacked Gate Flash EEPROM", by Yamada et al., IEDM 1991, page 307. The self-convergence technique has two steps, the first step is to bulk erase the array of flash EEPROM cells. After erasure, the second step is to converge the threshold voltages of the cells by injecting some electrons back into the floating gate by using avalanche hot carrier injection. The self-converging operation is accomplished by connecting both the control gate and the source to ground and the drain to a power supply voltage. The threshold voltages converge to a predetermined steady state value that may be adjusted by varying the channel doping. A problem with this technique is that there is a significant drain-source current that may be up to 10 microamps per cell during the self-convergence step. For a very large array size, the total current may be beyond what is practical for an integrated circuit implementation.

SUMMARY OF THE INVENTION

Accordingly, there is provided, in one form, an apparatus for erasing an array of flash EEPROM cells and for converging a threshold voltage distribution of the array to a predetermined voltage range. The cells are arranged in columns and rows, each cell includes a control gate, a floating gate, a source, and a drain. The drains of the cells in each of the columns are connected to a bit line, the sources are connected in common, and the control gates of the cells in each of the rows are connected to a word line. The apparatus includes an erasing circuit for electrically bulk erasing the flash EEPROM array to reduce a threshold voltage of each flash EEPROM cell to a relatively low voltage. The erasing circuit causes convergence of the distribution of threshold voltages within the predetermined voltage range by coupling the source and drain of each flash EEPROM cell of the array to a ground potential and applying a high voltage to the control gate of each flash EEPROM cell for a predetermined length of time. In another form, a method for erasing an array of flash EEPROM cells is provided. These and other features and advantages will be more clearly understood from the following detailed description taken in conjunction with the accompanying drawings.

DESCRIPTION OF A PREFERRED EMBODIMENT

Figure 1:
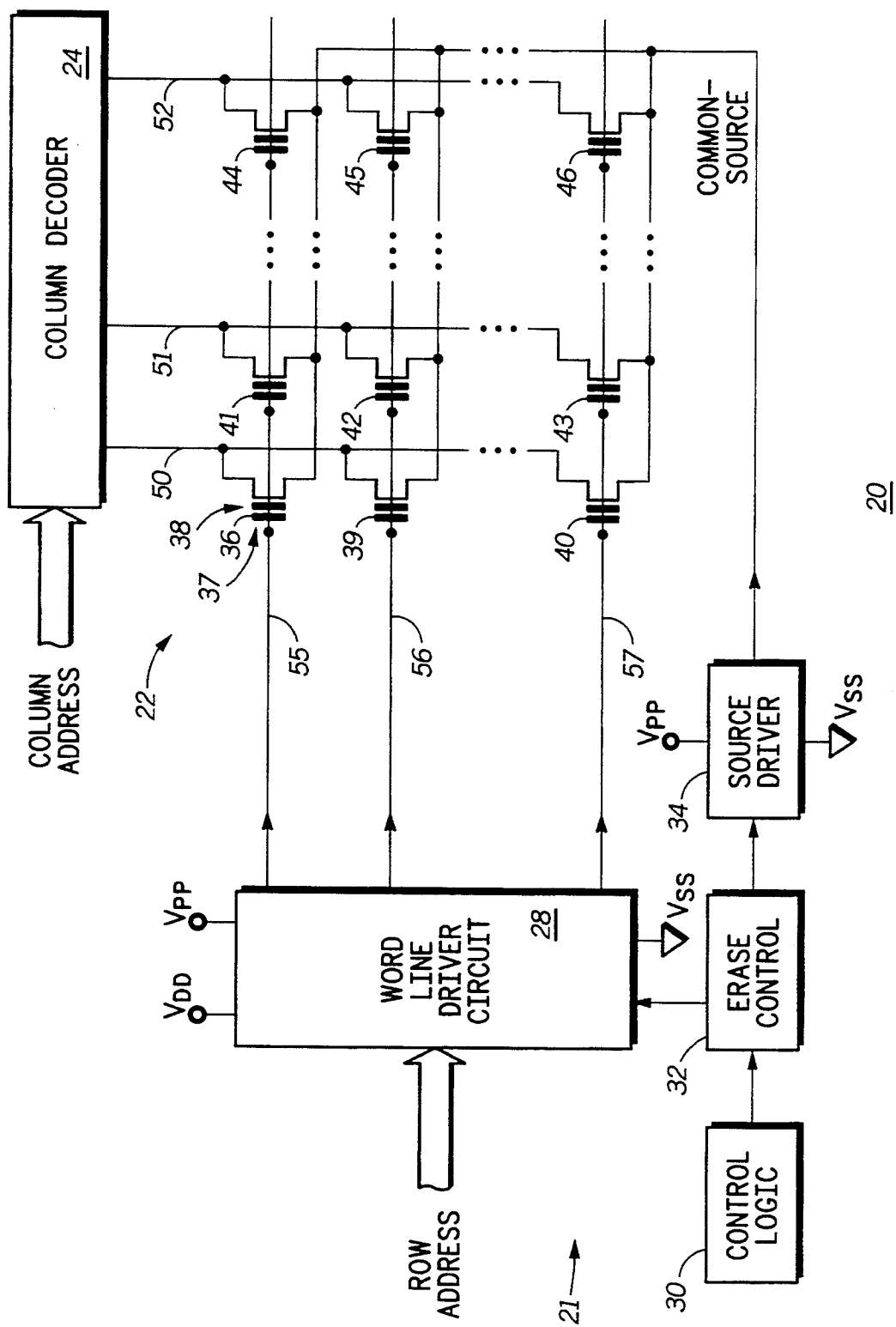
FIG. 1 illustrates in partial block diagram form and partial schematic diagram form a flash EEPROM circuit in accordance with the present invention.

FIG. 1 illustrates in partial block diagram form and partial schematic diagram form flash EEPROM circuit 20 in accordance with the present invention. Flash EEPROM circuit 20 includes erasing circuit 21 and flash EEPROM array 22. Erasing circuit 21 includes word line driver circuit 28, control logic 30, erase control circuit 32, and source driver 34. Flash EEPROM array 22 includes floating gate transistors 36, 39–46, bit lines 50, 51, and 52, and word lines 55, 56, and 57. All of the bit lines are coupled to a column decoder 24, and all of the word lines are coupled to word line driver circuit 28. Flash EEPROM array 22 is organized in row and columns. Flash EEPROM cells 36, 39, and 40 are coupled to bit line 50 and comprise a single column of flash EEPROM array 22. Likewise, flash EEPROM cells 41, 42, and 43 and bit line 51 comprise another column of flash EEPROM cells, and flash EEPROM cells 44, 45, and 46 and bit line 52 comprise another column of flash EEPROM cells. Word line 55 and flash EEPROM cells 36, 41, and 44 comprise a row of flash EEPROM array 22. Word line 56 and cells 39, 42, and 45 comprise another row of flash EEPROM array 22. Word line 57 and Cells 40, 43, and 46 comprise another row of flash EEPROM array 22. Each flash EEPROM cell includes a control gate, a floating gate, a drain, and a source. Each cell has a control gate coupled to a word line, a drain coupled to a bit line, and a source coupled to a common source terminal labeled "COMMON-SOURCE". For example, flash EEPROM cell 36 has a control gate 37 coupled to word line 55, a floating gate 38, a drain coupled to bit line 50, and a source coupled to common source terminal COMMON-SOURCE.

Column decoder 24 receives a column address signal labeled "COLUMN ADDRESS", and in response selects a bit line. Word line driver circuit 28 receives a row address signal labeled "ROW ADDRESS" from row decoders (not shown), and for enabling a word line. Word line driver circuit 28 is coupled to a positive power supply voltage terminal labeled "$V_{DD}$", a high voltage terminal labeled "$V_{PP}$", and negative power supply voltage terminal $V_{SS}$. A flash EEPROM cell is selected for a read cycle when the bit line to which it is coupled is selected and the word line to which it is coupled is enabled.

Erase control circuit 32 has an input terminal connected to an output terminal of control logic 30, a first output terminal connected to word line driver circuit 28, and a second output terminal connected to an input terminal of source driver 34. High voltage terminal $V_{PP}$ may be supplied with a high voltage from an external source by a user, or generated on the same integrated circuit as flash EEPROM circuit 20 using conventional charge pump circuitry, or the like. The high voltage source provides a high positive voltage greater than power supply voltage $V_{DD}$ for programming and erasing flash EEPROM array 22. High positive voltage $V_{PP}$ may be between 10 and 20 volts, however, the actual value for $V_{PP}$ depends on various factors such as the thickness of the tunnel oxide, the planned program and erase speed, and on the predetermined threshold voltage margin between programmed and unprogrammed cells. In the preferred embodiment, $V_{DD}$ is equal to 3.3 volts, $V_{SS}$ is at ground potential and $V_{PP}$ is equal to about 12 volts.

Flash EEPROM cell 36 is programmed using a conventional programming procedure that relies on hot carrier injection to transfer electrons to the floating gate. High positive voltage $V_{PP}$ is applied to control gate 37, while applying a predetermined voltage to the drain, and connecting the source to $V_{SS}$, or ground potential. In a preferred embodiment, the predetermined voltage is equal to about 7 volts. These bias conditions cause hot-carrier injection, which produces hot-electrons that collect on floating gate 38. Floating gate 38 is isolated from the drain and source regions of the cell by a thin oxide layer which causes electrons to be trapped on floating gate 38. When flash EEPROM cell 36 is programmed, a negative charge accumulates on floating gate 38 causing cell 36 to have a relatively high $V_T$. Because floating gate 38 is isolated by the thin oxide layer, flash EEPROM cell 36 may remain programmed for an extended period of time. (Circuits for programming flash EEPROM array 22 are not shown.)

Figure 2:
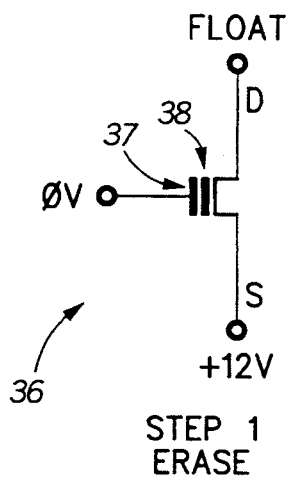
FIG. 2 illustrates in schematic diagram form, step one of the two-step erase method in accordance with the present invention.
Figure 3:
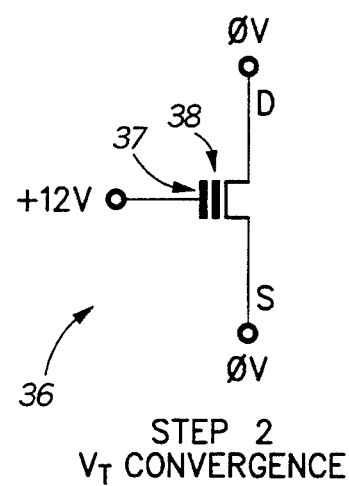
FIG. 3 illustrates in schematic diagram form, step two of the two-step erase method in accordance with the present invention.

To erase flash EEPROM array 22, a two-step erase method is used. The bias voltages used in the two-step erase method are illustrated in FIG. 2 and FIG. 3, where FIG. 2 illustrates the bias voltages of step 1 and FIG. 3 illustrates the bias voltages of step 2. In step 1, a conventional bulk erase procedure relying on Fowler-Nordheim tunneling is used to extract electrons from floating gate 38 of flash EEPROM cell 36. Each control gate 37 is coupled to $V_{SS}$, or ground potential, while high positive voltage $V_{PP}$ is applied to common-source terminal COMMON-SOURCE (FIG. 1) for a predetermined length of time. The drain of flash EEPROM cell 36 is allowed to float. In the preferred embodiment, the bias conditions of step 1 are maintained for about one second, in other embodiments, the bias conditions may be maintained for different lengths of time. To accomplish these bias conditions, control logic 30 provides an erase signal to erase control circuit 32. Erase control circuit 32 controls the two-step erase sequence. In step 1, a control signal from erase control circuit 32 causes word line driver circuit 28 to connect each of the word lines to zero volts or ground potential. Erase control circuit 32 then provides control signals to cause source driver 34 to connect $V_{PP}$ to common-source terminal COMMON-SOURCE. In a preferred embodiment, $V_{PP}$ is about 12 volts and the predetermined length of time is about 1 second. Step 1 causes the $V_T$ of floating gate 38 of each cell to be lower by a predetermined amount. However, because of various factors including process and timing variations, the $V_T$ of each cell of flash EEPROM array 22 may not be reduced at the same rate or by the same amount. Also, since normally only some of the cells are programmed during a programming cycle, some of the cells have a higher, programmed $V_T$ at the start of the erase cycle and some of the cells have a lower, non-programmed, $V_T$. Therefore, the $V_T$ distribution after performing step 1 on flash EEPROM array 22 may be 2 volts or more. A $V_T$ distribution of 2 volts may provide inadequate margins for operation at low power supply voltages such as 3.3 volts. In addition, some of the cells may have been over-erased as discussed above. The preferred $V_T$ distribution is about 1.0 volts or less. In other embodiments, flash EEPROM array 22 may be erased using other bias conditions. For example, 7 volts may be applied to control terminal 37 while 5 volts is applied to the source, and the drain is allowed to float.

In step 2 of the two-step erase method, labeled "STEP 2" in FIG. 3, a predetermined number of electrons are tunneled back into floating gate 38 to converge the $V_T$ distribution to about 1 volt or less. Fowler-Nordheim tunneling is also the mechanism used for step 2. Step 2 is accomplished by grounding the source terminals of each cell and applying $V_{PP}$ to control gate 37 of each cell. This bias condition is maintained for about 0.5 to 1.0 seconds. During step 2, erase control circuit 32 provides a control signal to source driver 34 to couple common-source terminal COMMON-SOURCE to $V_{SS}$, or ground potential. Erase control circuit 32 provides a control signal to word line driver circuit 28 to cause high voltage $V_{PP}$ to be provided to word lines 55, 56, and 57. Any charge on bit lines 50-52 is conducted through the cells to the common-source terminal COMMON-SOURCE, thus reducing the bit lines to ground potential. Some electrons are tunneled back from the substrate to floating gate 38 as a result of these bias conditions. The number of electrons tunneled back to floating gate 38 depends on how depleted of electrons the cell became after being erased. As stated above, some of the cells may be erased more than others. Fowler-Nordheim tunneling is very efficient for transporting electrons to and from the floating gate, with no significant parasitic currents involved. The cell threshold voltages converge to a particular "steady-state" level as a result of electrons tunneling from the substrate to the floating gate, and the tunneling current approaches a saturation value for the predetermined voltage level of $V_{PP}$. In the preferred embodiment, the $V_T$ distribution after step 2 is about 0.9 to 1.0 volts, in other embodiments, the threshold voltages may be converged to a narrower voltage range by maintaining the bias conditions for a longer period of time. The low current flow needed (about 10 nanoamperes) for converging the threshold voltages of the flash EEPROM cells of array 22 using the above 2-step method, is a distinct advantage, making high density low voltage flash EEPROMs more practical. In addition, the time required to perform the 2-step erase method is between 0.5 and 2 seconds, which is shorter than the intelligent erase method, which may take as long as 10 minutes.

Figure 4:
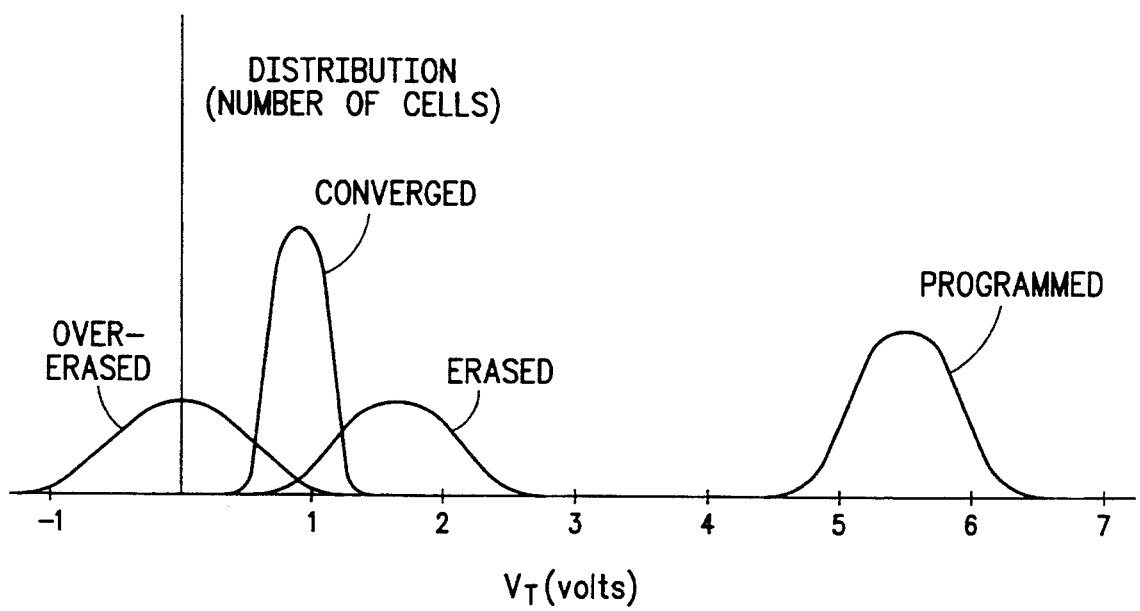
FIG. 4 illustrates a graph of threshold voltage distributions for a flash EEPROM array.

FIG. 4 illustrates a graph of threshold voltage distributions for flash EEPROM array 22. A distribution curve labeled "PROGRAMMED" illustrates an approximate distribution of cell threshold voltages $V_T$ in volts after all of the cells of flash EEPROM array 22 are programmed. A distribution curve labeled "ERASED" illustrates an approximate distribution of threshold voltages after using a conventional erase procedure with bias conditions as described for step 1 of the 2 step erase procedure. The $V_T$ distribution of curve ERASED is about 2 volts, and may be inadequate for operation with a 3.3 volt power supply. A $V_T$ distribution curve labeled "OVER-ERASED" illustrates the $V_T$ distribution of flash EEPROM array 22 after being erased using the conventional erase procedure as described for step 1 of the 2 step erase procedure. However, in the case of curve OVER-ERASED, some of the cells have been over-erased, causing the over-erased cells to have a negative threshold voltage. Array 22 may have been over-erased because either the erase bias conditions were maintained for too long, or because high voltage $V_{PP}$ was too high. The $V_T$ distribution illustrated by curve OVER-ERASED is about 2 volts between the highest $V_T$ and the lowest $V_T$. A curve labeled "CONVERGED" illustrates an approximate distribution of threshold voltages after step 2 of the 2-step erase procedure is performed on array 22 after it has been over-erased. As shown, the distribution of threshold voltages of flash EEPROM array 22 has been decreased from about 2 volts to about 0.9 volts. The threshold voltage of the cells that were negative have been increased to positive threshold voltages, causing them to function correctly as enhancement mode devices. The relatively narrow distribution of threshold voltages that result from using the 2 step erase method allows for reliable operation at low power supply voltages and relatively short erase times.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An apparatus for erasing an array of flash EEPROM cells and for converging a threshold voltage distribution of the array to a predetermined voltage range, the flash EEPROM cells arranged in columns and rows, each flash EEPROM cell including a control grate, a floating gate, a source, and a drain, the drains of the flash EEPROM cells in each of the columns connected to a bit line, the sources connected in common, and the control gates of the flash EEPROM cells in each of the rows connected to a word line, the apparatus comprising:

an erasing circuit for electrically bulk erasing the flash EEPROM array by applying a high voltage to the commonly connected sources and coupling the control gates to a ground potential to reduce a threshold voltage of each flash EEPROM cell to a relatively low voltage, and the erasing circuit for converging the distribution of threshold voltages within the predetermined voltage range by coupling the source and drain of each flash EEPROM cell of the array to the ground potential and applying the high voltage to the control gate of each flash EEPROM cell for a predetermined length of time after electrically bulk erasing the flash EEPROM array.

2. The apparatus of claim 1, wherein the array is electrically bulk erased by extracting electrons from the floating gate of each flash EEPROM cell by using a tunneling mechanism.

3. The apparatus of claim 1, wherein the predetermined voltage range is less than or equal to one volt.

4. The apparatus of claim 1, wherein the high voltage is characterized as being a high positive voltage greater than a positive power supply voltage.

5. The apparatus of claim 1, wherein the erasing circuit comprises:

an erase control circuit for receiving an erase signal, and in response, providing first and second control signals;

a source driver circuit for providing the high voltage to the commonly connected sources in response to receiving the first control signal, and for coupling the commonly connected sources to the ground potential in response to receiving the second control signal; and a word line driver circuit, coupled to each word line of the array, for coupling the control gates to the ground potential in response to the first control signal, and providing the high voltage to the control gates in response to the second control signal.

6. An apparatus for erasing an array of flash EEPROM cells and for converging a threshold voltage distribution of the array to a predetermined voltage range, said cells arranged in columns and rows, each flash EEPROM cell including a control gate, a floating gate, a source, and a drain, the drains of the flash EEPROM cells in each of the columns connected to a bit line, the sources connected in common, and the control gates of the flash EEPROM cells in each of the rows connected to a word line, the apparatus comprising:

an erase control circuit for receiving an erase signal, and in response, providing first and second control signals, the second control signal being provided subsequent to the first control signal;

a source driver circuit for providing a high voltage to the commonly connected sources in response to receiving the first control signal, and for coupling the commonly connected sources to the ground potential in response to receiving a second control signal; and a word line driver circuit, coupled to each word line of the array, for coupling the control gates to the ground potential in response to the first control signal, and providing the high voltage to the control gates in response to the second control signal;

wherein the apparatus electrically bulk erases the array by tunneling electrons from the floating gate of each flash EEPROM cell, and for subsequently converging the distribution of threshold voltages within the predetermined voltage range by coupling the source and drain of each flash EEPROM cell of the array to a ground potential and by applying a high voltage to the control gate of each flash EEPROM cell.

7. The apparatus of claim 6, wherein the predetermined voltage range is less than or equal to one volt.

8. The apparatus of claim 6, wherein the high voltage is characterized as being a high positive voltage greater than a positive power supply voltage.

9. A method for erasing an array of one transistor flash EEPROM cells and for converging a threshold voltage distribution of the array of flash EEPROM cells to within a predetermined voltage range, the array arranged in rows and columns, each flash EEPROM cell having a control gate, a floating gate, a source, and a drain, the drains of the cells in each of the columns connected to a bit line, the sources of all of the cells connected in common, the control gates of each of the rows connected to a word line, the method comprising the steps of:

electrically bulk erasing the array of flash EEPROM cells, comprising the steps of:
  coupling the control gate of each flash EEPROM cell to a ground potential; and
  applying a high voltage to the source of each flash EEPROM cell to reduce the threshold voltage of each flash EEPROM cell to a predetermined erased threshold voltage; and coupling the source and drain of each of the flash EEPROM cells to the ground potential while concurrently applying the high voltage to the control gate of each of the flash EEPROM cells, for converging the threshold voltage distribution of the array of flash EEPROM cells within the predetermined voltage range.

10. The method of claim 9, wherein the step of coupling further comprising applying a high positive voltage greater than a power supply voltage to the control gate of each of the flash EEPROM cells.

11. The method of claim 9, wherein the step of coupling further comprises the predetermined voltage range being less than or equal to one volt.

* * * * *